(12) United States Patent
Chan et al.

(10) Patent No.: US 7,852,109 B1
(45) Date of Patent: Dec. 14, 2010

(54) METHOD AND APPARATUS FOR SUPPLYING A CLOCK TO A DEVICE UNDER TEST

(75) Inventors: Chi Bun Chan, San Jose, CA (US); Jingzhao Ou, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 17 days.

(21) Appl. No.: 12/335,466

(22) Filed: Dec. 15, 2008

(51) Int. Cl.
*H03K 19/00* (2006.01)
(52) U.S. Cl. .............................. 326/16; 326/47; 326/93
(58) Field of Classification Search .................... 326/16, 326/37–41, 47
See application file for complete search history.

(56) References Cited

U.S. PATENT DOCUMENTS

2004/0215442 A1* 10/2004 Musselman .................. 703/24
2008/0312900 A1* 12/2008 Akiba et al. .................. 703/23

OTHER PUBLICATIONS

System Generator for DSP, Release 10.1, Mar. 2008, Chapter 3, entitled "Using Hardware Co-Simulation", pp. 175-188, Xilinx, Inc. 2100 Logic Drive, San Jose, CA 95124.

* cited by examiner

*Primary Examiner*—Rexford N Barnie
*Assistant Examiner*—Jany Tran
(74) *Attorney, Agent, or Firm*—T. Murray Smith; John J. King (57) ABSTRACT

A method and apparatus involves operating a circuit having a test circuit interrupt input terminal (INTERRUPT), having a test circuit clock output terminal (DUT_CLK), and having first and second operational modes. In the first operational mode the circuit supplies a test circuit clock signal to the test circuit clock output terminal. The circuit responds to receipt of an occurrence of a test circuit interrupt at the test circuit interrupt input terminal by then operating in the second operational mode. In the second operational mode the circuit refrains from supplying the test circuit clock signal to the test circuit clock output terminal.

20 Claims, 5 Drawing Sheets

METHOD AND APPARATUS FOR SUPPLYING A CLOCK TO A DEVICE UNDER TEST

FIELD OF THE INVENTION

The invention relates to integrated circuit devices (ICs). More particularly, the invention relates to testing of circuitry in an IC.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Designers using PLDs frequently find it necessary to test various aspects of their design, to determine whether the circuit operates in a manner different than what is desired. One approach for testing a design includes providing a free-running clock to the design under test. However, since the clock is free-running, the design under test continually receives clock signals, even after the circuit starts to deviate from its intended operation. This makes it difficult for a designer to see the states of various signals in the design during a period of time when the deviations occur. Another approach includes providing single clock pulses, one at a time, so that a designer can step through the operation of the circuit. In this manner, after each clock pulse, a designer can look at the states of various signals in the design. However, this approach means that a designer may need to step through many clock pulses before identifying the time when the design starts to deviate from the intended operation. Although these pre-existing approaches have been generally adequate for their intended purposes, they have not been entirely satisfactory in all respects.

SUMMARY

A circuit may have a test circuit interrupt input terminal, a test circuit clock output terminal, and first and second operational modes. In the first operational mode the circuit supplies a test circuit clock signal to the test circuit clock output terminal. In the second operational mode the test circuit clock output terminal is free of the test circuit clock signal. In response to receipt of an occurrence of a test circuit interrupt at the test circuit interrupt input terminal, the circuit then operates in the second operational mode.

A method of operating a circuit having a test circuit interrupt input terminal and a test circuit clock output terminal includes: supplying a test circuit clock signal to the test circuit clock output terminal in a first operational mode; responding to receipt of an occurrence of a test circuit interrupt at the test circuit interrupt input terminal by then operating in a second operational mode; and refraining from supplying the test circuit clock signal to the test circuit clock output terminal in the second operational mode.

DETAILED DESCRIPTION

Figure 1:
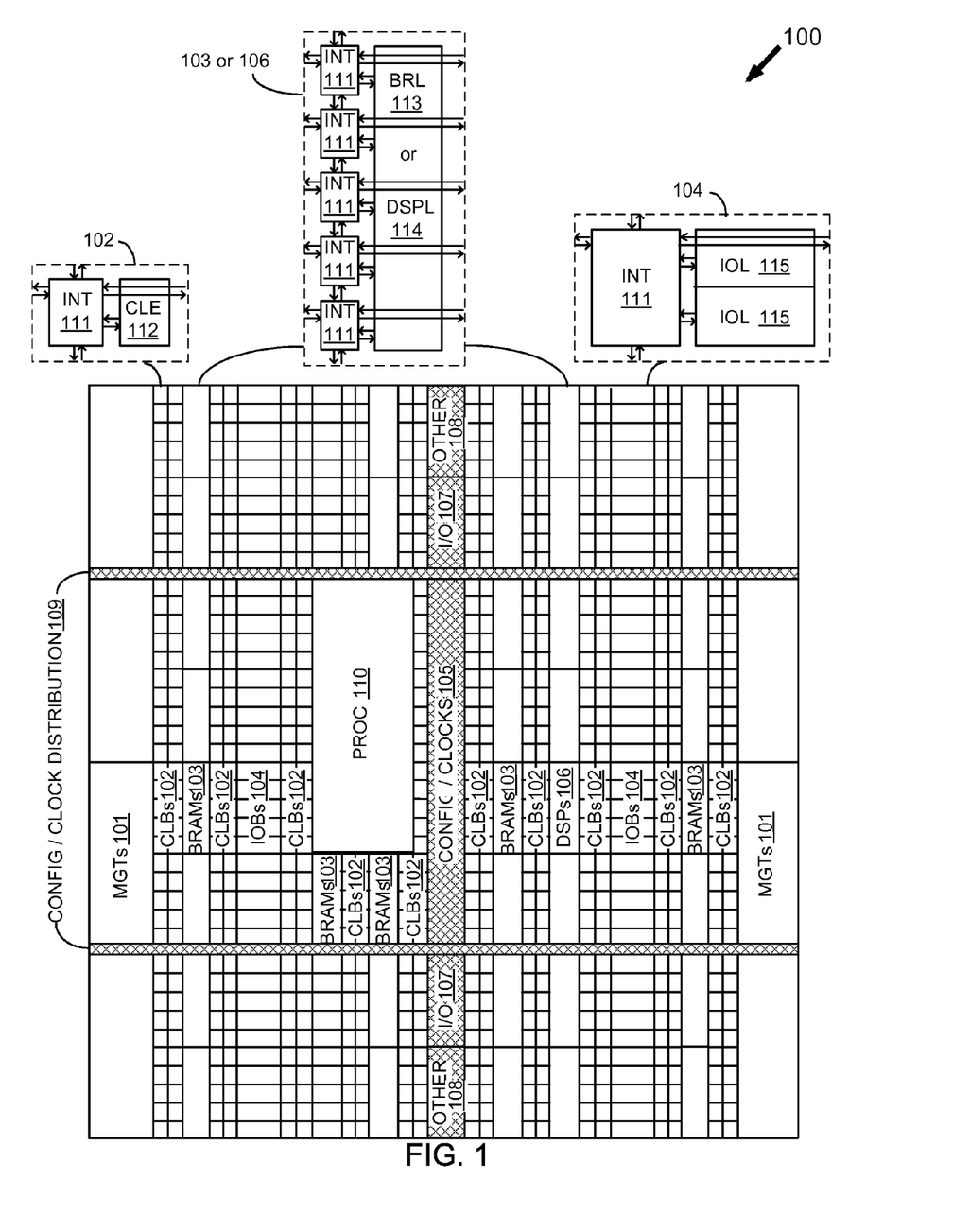
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
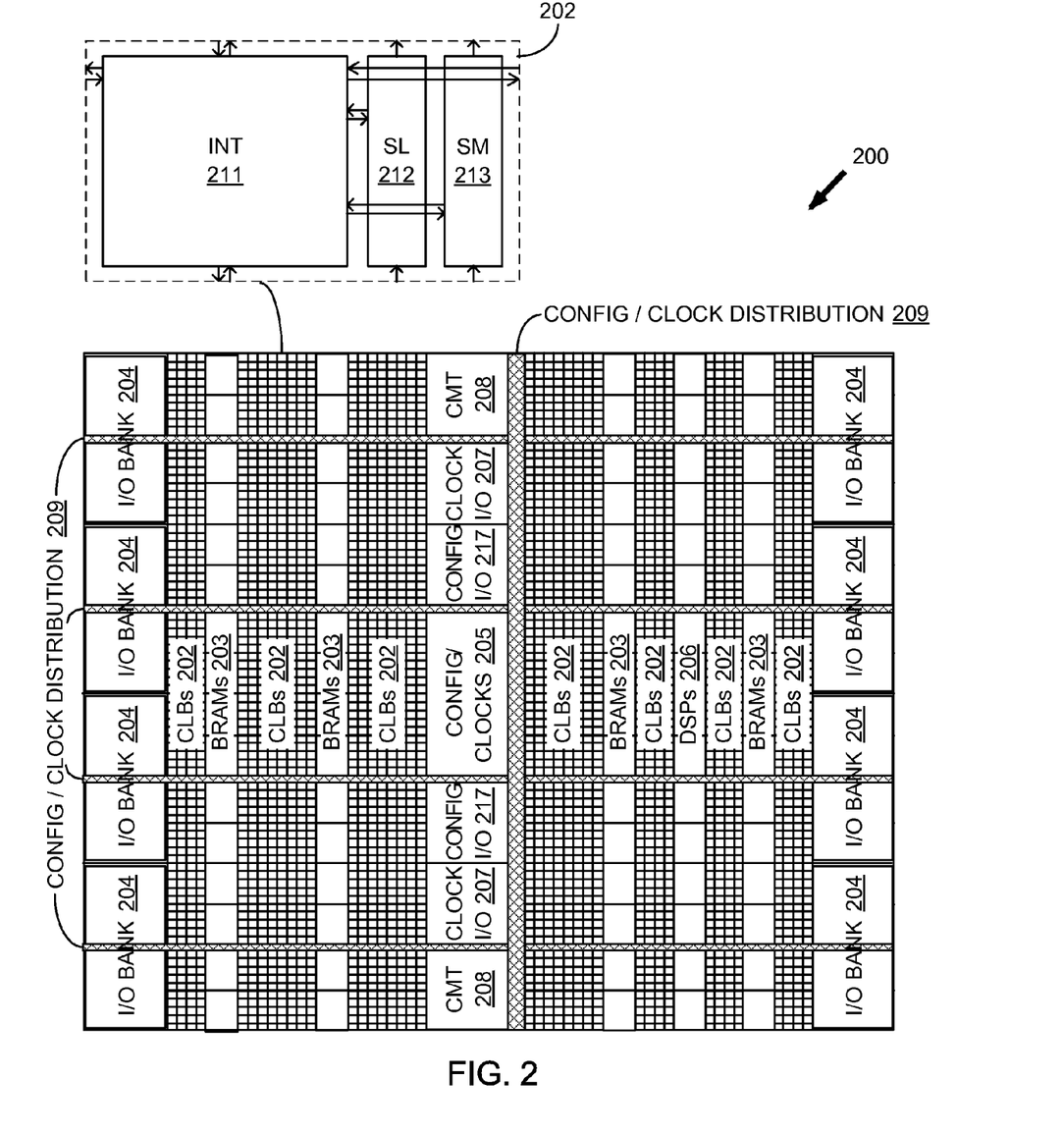
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
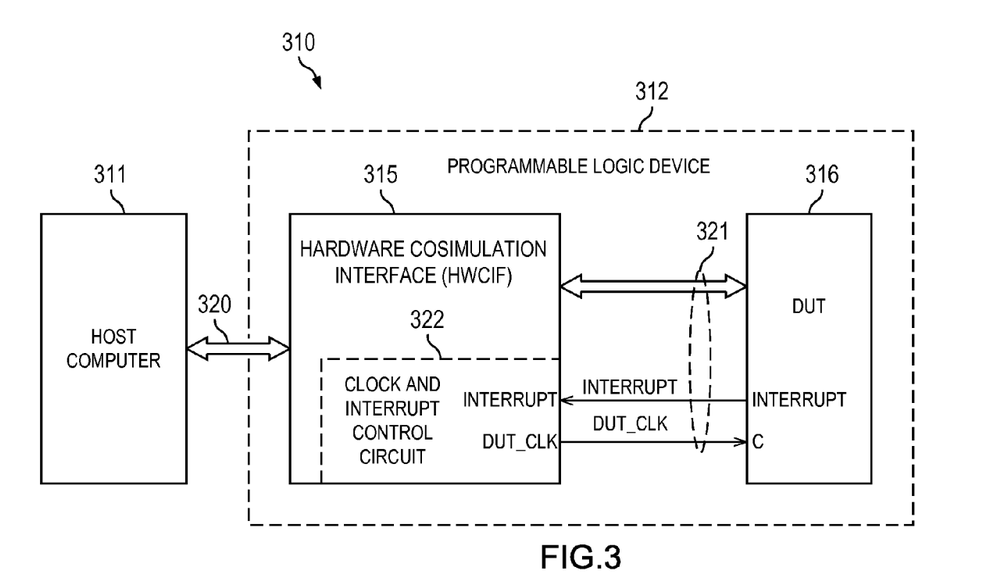
FIG. 3 is a block diagram of a test system that embodies aspects of the invention.

FIG. 3 is a block diagram of a test system 310 that embodies aspects of the invention. FIG. 3 includes a host computer 311 and a programmable logic device (PLD) 312. The PLD 312 can, for example, be an FPGA of the type shown in either of FIGS. 1 and 2. Note that while some examples herein describe a PLD or an FPGA, embodiments of the present invention may be used for testing and analysis in a variety of circuits and integrated circuits. The PLD 312 has a hardware co-simulation interface (HWCIF) 315 and a test circuit or design under test (DUT) 316. The HWCIF 315 is coupled to the host computer 311 by a communication link 320. In the disclosed embodiment, the communication link 320 is an Ethernet communication link conforming to the well-known Ethernet standard, but it could alternatively be an IEEE 1149.1 Joint Test Action Group (JTAG) communication link, or any other suitable standard or custom communication link. The HWCIF 315 is coupled to the DUT 316 by a test interface 321. The HWCIF 315 has a clock and interrupt control circuit 322. The circuit 322 has a test circuit interrupt input terminal INTERRUPT for receiving a signal INTERRUPT that is a test circuit interrupt, and a test circuit clock output terminal DUT_CLK that carries a DUT clock signal DUT_CLK serving as a test circuit clock signal. The DUT 316 has an output terminal INTERRUPT that is coupled through the test interface 321 to the input terminal INTERRUPT of the circuit 322, and that carries the signal INTERRUPT. In addition, the DUT 316 has a clock input terminal C that is coupled through the test interface 321 to the clock output terminal DUT_CLK of the circuit 322, and that receives the signal DUT_CLK.

When a circuit designer is designing the DUT 316, the designer can optionally include some test circuitry that is configured to actuate the interrupt signal INTERRUPT in response to one or more specified conditions. For example, the INTERRUPT signal could be actuated any time that a particular (not-illustrated) register within the DUT 316 happens to contain a specified value.

Figure 4:
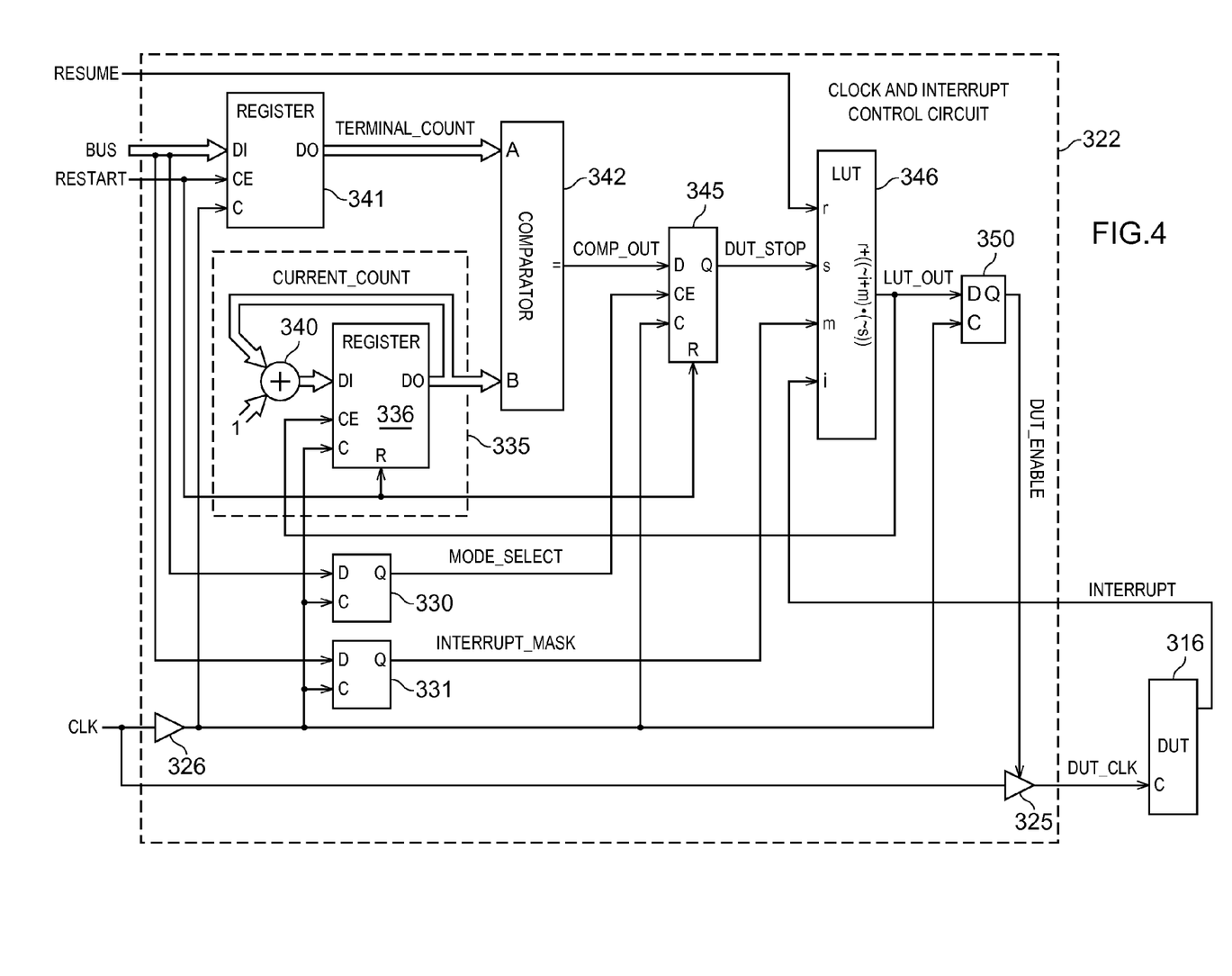
FIG. 4 is a circuit schematic showing in greater detail a clock and interrupt control circuit that is a portion of the circuitry shown in FIG. 3.

FIG. 4 is a circuit schematic showing in greater detail the clock and interrupt control circuit 322 of FIG. 3. The circuit 322 has an input terminal RESUME for receiving a signal RESUME, an input BUS coupled to a data bus BUS, an input terminal RESTART for receiving a signal RESTART, and a clock input terminal CLK for receiving a clock signal CLK. In the disclosed embodiment, the CLK signal is a free-running system clock signal. The circuit 322 further has the previously-mentioned input terminal INTERRUPT that receives the signal INTERRUPT, and the output terminal DUT_CLK that carries the signal DUT_CLK.

The circuit 322 has a buffer gate 325 that serves as a clock gate, with an input coupled to the clock input terminal CLK, and an output that is coupled to the output terminal DUT_CLK of the circuit 322, and thus to the clock input terminal C of the DUT 316. The gate 325 also has a control input. Moreover, the circuit 322 has a buffer 326 with an input that is coupled to the clock input terminal CLK, and an output. The circuit 322 further includes a D flip-flop 330 that is a clock mode storage element. The D flip-flop 330 has an input D coupled to one line of the input BUS, an output Q that carries a signal MODE_SELECT, and a clock input C that is coupled to the output of the buffer 326. In addition, the circuit 322 has a D flip-flop 331 that is an interrupt mode storage element. The D flip-flop 331 has an input D that is coupled to one line of the input BUS, an output Q that carries a signal INTERRUPT_MASK, and a clock input C that is coupled to the output terminal of the buffer 326.

The circuit 322 has a counter portion 335. The counter portion 335 includes a multi-bit register 336 that is a current count storage element for storing and outputting a value CURRENT_COUNT. The register 336 has a multi-bit data input DI, a clock enable input CE, a clock input C that is coupled to the output of the buffer 326, and a synchronous reset input R that is coupled to the input terminal RESTART. In addition, the register 336 has a multi-bit output DO that carries the value CURRENT_COUNT. Further, the counter portion 335 includes a multi-bit adder 340 with a multi-bit input that is coupled to the multi-bit output DO of the register 336, and a multi-bit input that is hardwired to receive a predetermined value of "1". In addition, the adder 340 has a multi-bit output that is coupled to the multi-bit data input DI of the register 336.

The circuit 322 further includes a multi-bit register 341 that is a terminal count storage element for storing and outputting a value TERMINAL_COUNT. The register 341 has a multi-bit input DI that is coupled to the input BUS, and a multi-bit output DO. The register 341 further includes a clock enable input CE that is coupled to the input terminal RESTART for receiving the signal RESTART, and a clock input C that is coupled to the output of the buffer 326.

In addition, the circuit 322 includes a multi-bit comparator 342 with a multi-bit input A that is coupled to the output DO of the register 341, a multi-bit input B that is coupled to the output DO of the register 336, and an output "=" that carries a signal COMP_OUT. The signal COMP_OUT is a logic high when CURRENT_COUNT and TERMINAL_COUNT are the same, and is a logic low when CURRENT_COUNT and TERMINAL_COUNT are different. The register 336, the adder 340, the register 341, and the comparator 342 collectively constitute a counter portion. The circuit 322 further has a D flip-flop 345 that is a clock pulse stop portion. The D flip-flop 345 has an input D that is coupled to the output "=" of the comparator 342, a clock enable input CE that is coupled to the output Q of the D flip-flop 330, a clock input C that is coupled to the output of the buffer 326, a synchronous reset input R that is coupled to the input terminal RESTART, and an output Q that carries a signal DUT_STOP.

The circuit 322 has a 16-by-1 read-only memory serving as a look-up-table (LUT) 346, with a resume input "r" that is coupled to the input terminal RESUME, a stop input "s" that is coupled to the output Q of the D flip-flop 345, an interrupt mask input "m" that is coupled to the output Q of the D flip-flop 331, and an interrupt input "i" that is coupled to the input terminal INTERRUPT. The LUT 346 further has an output that carries a signal LUT_OUT. The state of the output signal LUT_OUT depends on the state of the signals RESUME, DUT_STOP, INTERRUPT_MASK, and INTERRUPT that appear at the input terminals r, s, m, and i, respectively. In particular, the state of the output signal LUT_OUT can be expressed by the Boolean equation, LUT_OUT= r+((~i+m)·(~s)), where "~" represents inversion. The truth table for the LUT 346 is provided below as Table 1.

TABLE 1

| r | i | m | s | LUT_OUT |
|---|---|---|---|---------|
| 0 | 0 | 0 | 0 | 1 |
| 0 | 0 | 0 | 1 | 0 |
| 0 | 0 | 1 | 0 | 1 |
| 0 | 0 | 1 | 1 | 0 |
| 0 | 1 | 0 | 0 | 0 |
| 0 | 1 | 0 | 1 | 0 |
| 0 | 1 | 1 | 0 | 1 |
| 0 | 1 | 1 | 1 | 0 |
| 1 | 0 | 0 | 0 | 1 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

The circuit 322 further has a D flip-flop 350 that has an input D that is coupled to the output of the LUT 346, a clock input C that is coupled to the output of the buffer 326, and an output Q that is coupled to the control input of the gate 325. The LUT 346 and the D flip-flop 350 together serve as a clock enable portion of the circuit 322.

Figure 5:
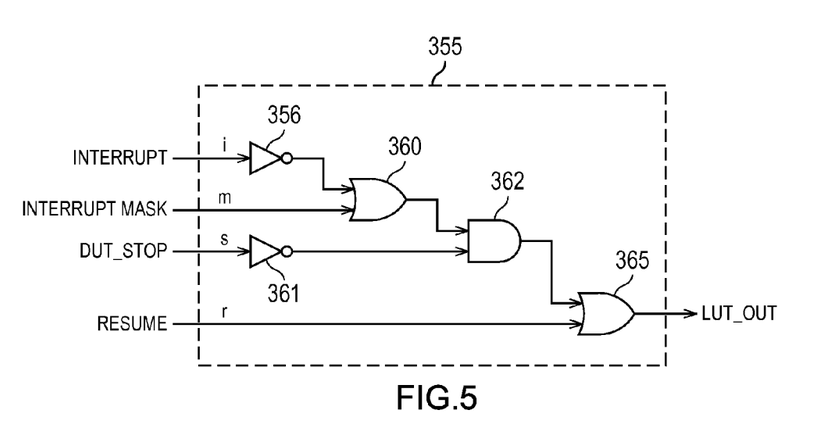
FIG. 5 is a circuit that is the functional equivalent of a look-up-table that is a portion of the circuitry shown in FIG. 4.

FIG. 5 shows a circuit 355 that is the functional equivalent of, and could optionally be substituted for, the LUT 346 of FIG. 4. The circuit 355 uses combinational logic to implement the logical function LUT_OUT=r+((~i+m)·(~s)). The circuit 355 includes an inverter 356 with an input that receives the signal INTERRUPT. The circuit 355 further has a two-input OR gate 360 with an input that is coupled to the output of the inverter 356, an input that receives the signal INTERRUPT_MASK, and an output. In addition the circuit 355 has an inverter 361 with an input that receives the signal DUT_STOP, and an output. Moreover, the circuit 355 includes a two-input AND gate 362 with an input that is coupled to the output of the OR gate 360, an input that is coupled to the output of the inverter 361, and an output. Also, the circuit 355 has another two-input OR gate 365 with an input that is coupled to the output of the AND gate 362, an input that receives the signal RESUME, and an output that carries the signal LUT_OUT.

Referring to FIG. 4, the circuit 322 has a clock enabled mode and a clock disabled mode. In the clock enabled mode, the gate 325 is enabled, causing the clock signal CLK to pass therethrough to the output terminal DUT_CLK. Thus, the signal DUT_CLK mirrors the clock signal CLK when the circuit 322 operates in the clock enabled mode. In the clock disabled mode, the gate 325 is disabled, inhibiting the clock signal CLK from passing therethrough to the output terminal DUT_CLK. Therefore, the signal DUT_CLK is low when the circuit 322 operates in the clock disabled mode.

The circuit 322 has a count enabled mode and a count disabled mode. In the count enabled mode, and as explained in more detail later, the circuit 322 produces a specified number of clock pulses at the output terminal DUT_CLK, and then disables the gate 325. In the count disabled mode, the circuit 322 ignores the number of clock pulses that appear at the output terminal DUT_CLK. The output Q of the D flip-flop 330 determines which one of the count enabled and disabled modes the circuit 322 is in. When the output Q of the D flip-flop 330 is high the circuit 322 is in the count enabled mode. When the output Q of the D flip-flop 330 is low the circuit 322 is in the count disabled mode.

In addition, the circuit 322 has an interrupt enabled mode and an interrupt disabled mode. In the interrupt enabled mode, and as explained in more detail later, the circuit 322 responds to an occurrence of the signal INTERRUPT at the input terminal INTERRUPT by disabling the gate 325. In the interrupt disabled mode, the circuit 322 ignores any occurrence of the signal INTERRUPT at the input terminal INTERRUPT. The output Q of the D flip-flop 331 determines which one of the interrupt enabled and disabled modes the circuit 322 is in. When the output Q of the D flip-flop 331 is in a low state the circuit 322 is in the interrupt enabled mode. When the output Q of the D flip-flop 331 is in a high state the circuit 322 is in the interrupt disabled mode.

To facilitate an understanding of the operation of the circuit 322, for now assume that the signal RESUME that appears at the input terminal RESUME of the LUT 346 is low, so the state of the resume input r of the LUT 346 is low.

Taking into account the various possible states of the D flip-flops 330 and 331, the operation of the circuit 322 can be discussed in the context of four different scenarios. First consider the operation of the circuit 322 when the state of the D flip-flop 330 is low and the state of the D flip-flop 331 is high. In this first scenario, the circuit 322 is in the count disabled mode and interrupt disabled mode.

First focus on the effect that the count disabled mode has on the operation of the circuit 322. The low state at the output Q of the D flip-flop 330 appears at the clock enable input CE of the D flip-flop 345. In turn, the D flip-flop 345 is disabled and the output Q of the D flip-flop 345 will be low because the D flip-flop 345 has been reset in a manner discussed later. The low state at the output Q of the D flip-flop 345 appears at the input s of the LUT 346. Now focus on the effect that the interrupt disabled mode has on the operation of the circuit 322. In the interrupt disabled mode, the output Q of the D flip-flop 331 is high and carries the signal INTERRUPT_MASK that appears at the input m of the LUT 346. When r=0, s=0, and m=1, the output LUT_OUT of the LUT 346 is high, without regard to the input i. The signal LUT_OUT is high and appears at the input D of the D flip-flop 350. This is clocked into the D flip-flop 350 with each pulse of the clock signal CLK, so that the output Q of the D flip-flop 350 is high. As a result, the signal DUT_ENABLE is high and appears at the control input of the gate 325. In turn, the gate 325 is continuously enabled, causing the clock signal CLK to pass therethrough to the output DUT_CLK.

Now turn to an explanation of the operation of the circuit 322 when the state of the output Q of the D flip-flop 330 is low and the state of the output Q of the D flip-flop 331 is low. In this second scenario, the circuit 322 is in the count disabled mode and the interrupt enabled mode. The effect that the count disabled mode has on the circuit 322 has been previously discussed. In the interrupt enabled mode, the signal INTERRUPT_MASK is low and appears at the interrupt mask input m of the LUT 346. The states of the inputs r and s are also low, as previously explained. In the absence of an occurrence of the signal INTERRUPT, the state of the input i of the LUT 346 is low. As a result, the output LUT_OUT is high. The high signal LUT_OUT appears at the input D of the D flip-flop 350. Each pulse of the clock signal CLK clocks this high into the D flip-flop 350, so that the output Q of the D flip-flop 350 is high. The signal DUT_ENABLE is thus high and appears at the control input of the gate 325. In turn, the gate 325 is enabled and passes the clock signal CLK therethrough to the output terminal DUT_CLK.

When there is an occurrence of the signal INTERRUPT, the state of the input i of the LUT 346 changes from low to high. As a result, the output LUT_OUT goes low and appears at the input D of the D flip-flop 350. At the next leading edge of the clock signal CLK the output Q of the D flip-flop 350 is set to low. The signal DUT_ENABLE is thus low and appears at the control input of the gate 325. In turn, the gate 325 is disabled and inhibits the clock signal CLK from passing therethrough to the output terminal DUT_CLK. Thus, the circuit 322 then operates in the clock disabled mode.

In due course, a pulse is applied to the input terminal RESUME and the input r of the LUT 346 goes high. This causes the output LUT_OUT of the LUT 346 to go high and the high signal LUT_OUT appears at the input D of the D flip-flop 350. At the next leading edge of the clock signal CLK, the output Q of the D flip-flop 350 goes high. In turn, the signal DUT_ENABLE goes high and appears at the control input of the gate 325. This enables the gate 325 so that the clock signal CLK passes therethrough to the output terminal DUT_CLK. In this manner, the circuit 322 resumes operation in the clock enabled mode.

Now turn to an explanation of the operation of the circuit 322 when the output Q of the D flip-flop 330 is high and the output Q of the D flip-flop 331 is high. In this third scenario, the circuit 322 is in the count enabled mode and the interrupt disabled mode. The effect that the interrupt disabled mode has on the circuit 322 has been previously discussed. Therefore, now focus on the effect that the count enabled mode has on the circuit 322.

In the count enabled mode, the counter portion 335 maintains a CURRENT_COUNT value that corresponds to a specified number of pulses being supplied to the output terminal DUT_CLK from a specified point in time. First the signal RESTART is actuated for a period of time so that a pulse appears at the clock enable input CE of the register 341, the synchronous reset input R of the register 336, and the synchronous reset input R of the D flip-flop 345. Also, before the next leading edge of the clock signal CLK, a value that is one less than the specified number of clock pulses is supplied to the BUS. Therefore, at the next leading edge of the clock signal CLK, the value on the BUS is clocked into the register 341 as the TERMINAL_COUNT value, and that value then appears at the output DO of the register 341. Also, the register 336 and the D flip-flop 345 are both reset at that same leading edge of the clock signal CLK because of the pulse in the signal RESTART. Thus, the CURRENT_COUNT value at the output DO of the register 336 is zero and the signal DUT_STOP is low.

After that leading edge of the clock signal CLK and before the next leading edge of the clock signal CLK, the adder 340 takes the CURRENT_COUNT value from the output DO of the register 336 and increments it. The adder then supplies the incremented value to the input DI of the register 336. This happens between each pair of successive leading edges of the clock signal CLK. At each successive leading edge of the clock signal CLK, the incremented value at the input DI of the register 336 is clocked into the register 336 and appears at the output DO of the register 336 as the new CURRENT_COUNT value. The register 336 thus counts up from zero.

The comparator 342 takes the CURRENT_COUNT value from the output DO of the register 336 and compares it to the TERMINAL_COUNT value from the output DO of the register 341. When the CURRENT_COUNT and TERMINAL_COUNT values are different, the output "=" of the comparator 342 and the signal COMP_OUT are low. In the count enabled mode, the signal MODE_SELECT is high which enables the D flip-flop 345 to pass the state of the signal COMP_OUT to the output Q of the D flip-flop 345 on each leading edge of the clock signal CLK. Therefore, at the next leading edge of the clock signal CLK the output Q of the D flip-flop 345 goes low. The signal DUT_STOP at the input s is also low. In that situation, the state of the inputs r, s, and m are respectively low, low, and high. Therefore, in accordance with the Boolean equation that expresses the state of the output signal LUT_OUT of the LUT 346, the output signal LUT_OUT is high. The high signal LUT_OUT enables the register 336 which causes the counter portion 335 to continue counting up. The high state of the output signal LUT_OUT appears at the D input of the D flip-flop 350, causing the output thereof and the signal DUT_ENABLE to be high at the next leading edge of the clock signal CLK. Since the signal DUT_ENABLE goes high, the gate 325 is enabled and passes the clock signal CLK to the output terminal DUT_CLK.

When an increment of CURRENT_COUNT causes CURRENT_COUNT and TERMINAL_COUNT to be equal, the output "=" of the comparator 342 and the signal COMP_OUT go high. As explained above, the D flip-flop 345 is enabled in the count enabled mode and thus, the output Q thereof goes high at the next leading edge of the clock signal CLK. When the output Q of the D flip-flop 345 is high, the state of the input s of the LUT 346 is also high. In that situation, the states of the inputs r, s, and m are respectively low, high, and high. Therefore, in accordance with the Boolean equation that expresses the state of the output signal LUT_OUT of the LUT 346, the output signal LUT_OUT goes low. The low state of the output signal LUT_OUT appears at the clock enable input CE of the register 336. Thus, the register 336 is disabled, causing the counter portion 335 to halt incrementing the CURRENT_COUNT value. Instead, the counter portion 335 maintains most recent CURRENT_COUNT value at the output DO of the register 336. The low state of the output signal LUT_OUT appears at the D input of the D flip-flop 350. At the next leading edge of the clock signal CLK, the signal DUT_ENABLE goes low, inhibiting the gate 325 from passing the clock signal CLK to the output terminal DUT_CLK.

Figure 6:
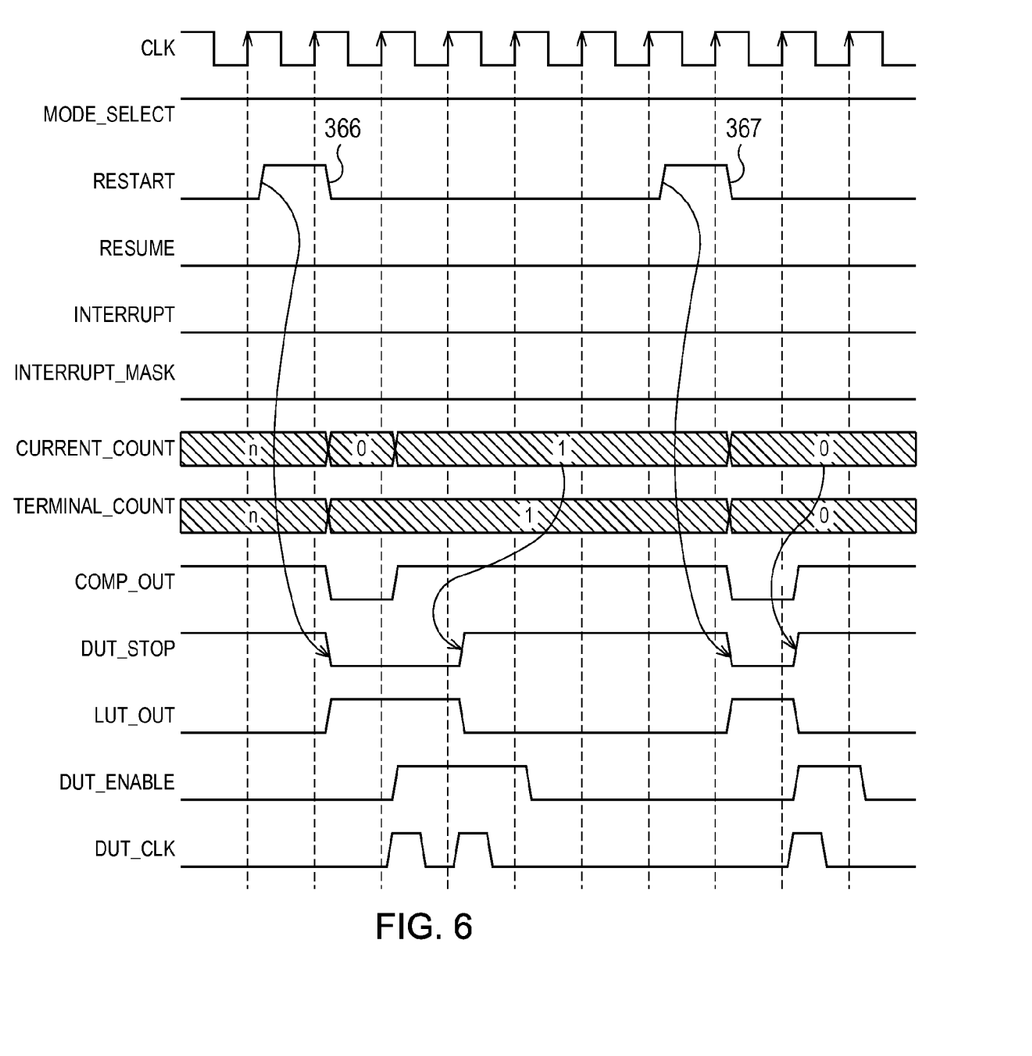
FIG. 6 is a timing diagram showing the states of various signals during operation of the circuit shown in FIG. 4.

FIG. 6 is a timing diagram showing the states of various signals in FIG. 4 during the operation of the circuit 322 in the clock enabled and interrupt disabled modes. The left half of the timing diagram shows the states of the signals in the circuit 322 during operation of the circuit 322 to generate two clock pulses. The right half of the timing diagram shows the states of signals in the circuit 322 during operation of the circuit 322 to generate one clock pulse.

A pulse 366 in the signal RESTART is provided to reset the CURRENT_COUNT value in register 336, load the TERMINAL_COUNT value into register 341, and also reset the D flip-flop 345 that outputs the signal DUT_STOP. Here, the register 341 is loaded with the value "1", which is one less than the specified number (two) of clock pulses of the signal DUT_CLK to be produced by the circuit 322. As shown in FIG. 6, the pulse 366 causes the circuit 322 to generate two pulses of the signal DUT_CLK. Later, another pulse 367 in the signal RESTART is provided. Here the register 341 is loaded with the value of "0," and the circuit 322 generates a single pulse of the signal DUT_CLK.

Referring back to FIG. 5, now turn to an explanation of the operation of the circuit 322 when the state of the D flip-flop 330 is high and the state of the D flip-flop 331 is low. In this fourth scenario, the circuit 322 is in the count enabled mode and interrupt enabled mode. The effects that the count and interrupt enabled modes each have separately on the circuit 322 have been previously discussed. In the absence of an occurrence of the signal INTERRUPT, the circuit 322 performs as previously discussed above. Assume that the counter portion 335 is in the process of counting a specified number of pulses that are to be produced at the output terminal DUT_CLK. Now focus on the operation of the circuit 322 when there is an occurrence of a signal INTERRUPT before the specified number of clock pulses has been supplied to the output terminal DUT_CLK.

Upon an occurrence of the signal INTERRUPT, the input i of the LUT 346 goes high, the signal LUT_OUT immediately goes low and is applied to the clock enable input CE of the register 336 to disable clocking of the register 336. As a result, the states of the input DI and the output DO of the register 336 remain the same as just before the occurrence of the signal INTERRUPT. In this manner, the circuit 322 maintains the CURRENT_COUNT value without change following the occurrence of the signal INTERRUPT. The low signal LUT_OUT is also clocked into the D flip-flop 350, so that DUT_ENABLE goes low and disables the gate 325 to stop the DUT_CLK signal, in the manner discussed earlier.

In due course, a pulse is applied to the input terminal RESUME and the input r of the LUT 346 goes high. This causes the output LUT_OUT of the LUT 346 to go high. The high signal LUT_OUT appears at the clock enable input CE of the register 336 and causes it to resume counting from the value of CURRENT_COUNT that existed when the interrupt occurred. Moreover, as previously discussed, at the next leading edge of the clock signal CLK, LUT_OUT is clocked into the D flip-flop 350. The signal DUT_ENABLE goes high and appears at the control terminal of the gate 325, causing the clock signal to pass therethrough to the output terminal DUT_CLK and to the clock input C of the DUT 316. The counter portion 335 counts up until CURRENT_COUNT equals TERMINAL_COUNT, causing the output "=" of the comparator 342 and the signal COMP_OUT to go high. As a result, the circuit then enters the clock disabled mode again, in the manner discussed earlier.

The circuit 322 in FIGS. 3 and 4 is compact in size and can be efficiently implemented on a PLD (such as the FPGAs shown in FIGS. 1 and 2) using standard logic components typically available on a PLD. The circuit may be similarly efficiently implemented in other circuits and integrated circuits. Further, the circuit 322 permits the DUT 316 to generate an interrupt that stops the DUT clock signal DUT_CLK, thereby providing the DUT with the capability to stop its own execution in order to facilitate test and debugging. The circuit 322 permits the DUT 316 to be tested in any of several different modes, including a mode where the DUT clock signal DUT_CLK is single stepped, a mode where DUT-CLK is free-running, a mode where the free-running DUT_CLK can be halted by an interrupt from the DUT and then restarted, and a mode where a specified number of pulses of DUT_CLK are supplied to the DUT, including the capability to interrupt and then restart DUT_CLK while the specified number of pulses is being supplied to the DUT.

What is claimed is:

1. A circuit comprising:
   a test circuit interrupt input terminal;
   a test circuit clock output terminal; and
   a control circuit coupled to the test circuit interrupt input terminal, the control circuit having a counter;
   the circuit having first and second operational modes,
   wherein in the first operational mode the circuit supplies a test circuit clock signal to the test circuit clock output terminal for a predetermined count generated by the counter, wherein in the second operational mode the test circuit clock output terminal is free of the test circuit clock signal, and wherein in response to receiving of a test circuit interrupt signal, generated by a device under test, at the test circuit interrupt input terminal, the circuit then operates in the second operational mode and the counter is disabled during an interrupt period established by the test circuit interrupt signal before reaching the predetermined count.

2. The circuit according to claim 1, wherein the circuit has an interrupt disabled mode in which the test circuit interrupt input terminal is ignored, and an interrupt enabled mode in which the circuit responds to the test circuit interrupt signal at the test circuit interrupt input terminal by operating in the second operational mode.

3. The circuit according to claim 2, wherein the circuit includes a clock gate that receives a system clock and has an output coupled to the test circuit clock output terminal, and a clock enable portion coupled between the test circuit interrupt input terminal and the clock gate;

wherein in the first operational mode the clock enable portion supplies an actuated clock enable signal to the clock gate, the actuated clock enable signal enabling the clock gate to pass the system clock therethrough so it appears at the test circuit clock output terminal as the test circuit clock signal; and wherein in the second operational mode the clock enable portion supplies a deactuated clock enable signal to the clock gate, the deactuated clock enable signal disabling the clock gate from passing the system clock therethrough to the test circuit clock output terminal.

4. The circuit according to claim 3, wherein the circuit has an interrupt mode storage element having an input for receiving a logical value to be maintained therein, and being coupled to the clock enable portion; and wherein when the logical value maintained in the interrupt mode storage element has a first state the circuit operates in the interrupt enabled mode, and when the logical value maintained in the interrupt mode storage element has a second state different from the first state the circuit operates in the interrupt disabled mode.

5. The circuit according to claim 4, wherein the clock enable portion includes a lookup table having inputs coupled to the interrupt mode storage element and the test circuit interrupt input terminal, and having an output;

wherein the clock enable portion includes a flip-flop having an input coupled to the output of the lookup table, and having an output coupled to the clock gate, the output of the flip-flop supplying the clock enable signal to the clock gate;

wherein when the circuit operates in the interrupt enabled mode, in response to the test circuit interrupt signal, the lookup table deactuates the input of the flip-flop, thereby causing the output of the flip-flop to supply a deactuated clock enable signal to the clock gate; and wherein when the circuit operates in the interrupt disabled mode, the lookup table actuates the input of the flip-flop, thereby causing the output of the flip-flop to supply an actuated clock enable signal to the clock gate.

6. The circuit according to claim 1, wherein the circuit has a resume input terminal; and wherein during the second operational mode the circuit responds to an occurrence of a resume signal at the resume input terminal by then operating in the first operational mode.

7. The circuit according to claim 1, wherein after an occurrence at the test circuit clock output terminal of a specified number of pulses of the test circuit clock signal, beginning from a specified point in time, the circuit then operates in the second operational mode.

8. The circuit according to claim 7, wherein the circuit adjusts a first value maintained in the circuit for each pulse of the test circuit clock signal supplied to the test circuit clock output terminal, and wherein the first value relative to a second value maintained in the circuit indicates the number of pulses remaining before the specified number of pulses is reached.

9. The circuit according to claim 8, wherein the counter comprises a current count storage element having an input, and having an output, the first value being maintained in the current count storage element, an adder coupled between the input and the output of the current count storage element, the adder incrementing values passing through it, a terminal count storage element having an input for receiving the second value, and having an output, and a comparator coupled to the outputs of the current count and terminal count storage elements for comparing the first and second values, and having an output;

wherein the second value is indicative of the specified number;

wherein the first value maintained in the circuit is reset at the specified point in time;

wherein the circuit adjusts the first value by having the adder increase the first value for each pulse supplied by the circuit to the test circuit clock output terminal, the adjusted first value then being stored in the current count storage element;

wherein when the first and second values are different the comparator actuates its output to cause the circuit to supply the test circuit clock signal to the test circuit clock output terminal; and wherein when the first and second values are equivalent the comparator deactuates its output to cause the circuit to cease supplying the test circuit clock signal to the test circuit clock output terminal.

10. The circuit according to claim 9, wherein the circuit includes a clock gate that receives a system clock and has an output coupled to the test circuit clock output terminal, and a clock enable portion having an input coupled to the test circuit interrupt input terminal, having an input coupled to the output of the comparator, and having an output coupled to the clock gate;

wherein in the first operational mode the clock enable portion supplies an actuated clock enable signal to the clock gate, the actuated clock enable signal enabling the clock gate to pass the system clock therethrough so it appears at the test circuit clock output terminal as the test circuit clock signal; and wherein in the second operational mode the clock enable portion supplies a deactuated clock enable signal to the clock gate, the deactuated clock enable signal disabling the clock gate from passing the system clock therethrough to the test circuit clock output terminal.

11. The circuit according to claim 7, wherein the circuit has a count disabled mode in which the circuit ignores the number of pulses supplied to the test circuit clock output terminal, and a count enabled mode in which, after an occurrence at the test circuit clock output terminal of the specified number of pulses of the test circuit clock signal, the circuit then operates in the second operational mode.

12. The circuit according to claim 11,
wherein the circuit has a clock enable portion having an input coupled to the test circuit interrupt input terminal, having a stop input, having an input for receiving a system clock, and having an output coupled to the test circuit clock output terminal;
wherein the circuit has a counter portion for determining whether the last of the specified number of pulses is about to be supplied to the test circuit clock output terminal by the circuit, the counter portion having an input for receiving a value representing the specified number of pulses, and having an output, the output being deactuated in the count enabled mode until the last of the specified number of pulses is about to be supplied to the test circuit clock output terminal;
wherein the circuit has a clock mode storage element having an input for receiving a logical value to be maintained therein, the state of the logical value indicating which of the clock enabled and disabled modes the circuit should operate in;
wherein the circuit has a clock pulse stop portion having an input coupled to the output of the counter portion, having an output coupled to the stop input of the clock enable portion, and having a control terminal coupled to the output of the clock mode storage element;
wherein in the count enabled mode, the actuation state of the output of the stop portion follows the actuation state of the input thereof;
wherein in the count disabled mode the output of the clock pulse stop portion is deactuated without regard to the actuation state of the input thereof;
wherein in the absence of the interrupt signal while the output of the clock pulse stop portion is deactuated, the clock enable portion permits the system clock to pass therethrough to the test circuit clock output terminal, the circuit operating in the first operational mode;
wherein in response to the output of the clock pulse stop portion being actuated, the clock enable portion inhibits the system clock from passing therethrough to the test circuit clock output terminal, the circuit then operating in the second operational mode; and
wherein in response to the interrupt signal and without regard to the actuation state of the output of the clock pulse stop portion, the clock enable portion inhibits the system clock from passing therethrough to the test circuit clock output terminal, the circuit then operating in the second operational mode.

13. The circuit according to claim 7,
wherein the circuit has a resume input terminal; and
wherein during the second operational mode and after an occurrence at the test circuit clock output terminal of the specified number of pulses of the test circuit clock signal, the circuit responds to an occurrence of a resume signal at the resume input terminal by then operating in the first operational mode.

14. The circuit according to claim 7, wherein during the first operational mode, after the specified point in time and before an occurrence at the test circuit clock output terminal of the specified number of pulses of the test circuit clock signal, the circuit responds to the test circuit interrupt signal at the test circuit interrupt input terminal by then operating in the second operational mode while suspending counting of clock pulses at the test circuit clock output terminal.

15. The circuit according to claim 14,
wherein the circuit has a resume input terminal; and
wherein during the second operational mode after receiving the test circuit interrupt signal, the circuit responds to an occurrence of a resume signal at the resume input terminal by then operating in the first operational mode while resuming counting of clock pulses at the output terminal.

16. The circuit according to claim 14, wherein the circuit has an interrupt disabled mode in which the test circuit interrupt input terminal is ignored, and an interrupt enabled mode in which, during the first operational mode, the circuit responds to the test circuit interrupt signal at the test circuit interrupt input terminal by operating in the second operational mode.

17. A method of operating a circuit having a test circuit interrupt input terminal and a test circuit clock output terminal, the method comprising:
supplying a test circuit clock signal to the test circuit clock output terminal in a first operational mode during a period established by a predetermined count of a counter;
responding to receipt of a test circuit interrupt signal, generated by a device under test, at the test circuit interrupt input terminal by then operating in a second operational mode;
refraining from supplying the test circuit clock signal to the test circuit clock output terminal in the second operational mode; and
disabling the counter before reaching the predetermined count during an interrupt period established by the test circuit interrupt signal.

18. The method according to claim 17,
including ignoring test circuit interrupts at the test circuit interrupt input terminal during an interrupt disabled mode; and
including responding to the test circuit interrupt signal at the test circuit interrupt input terminal during an interrupt enabled mode by then operating in the second operational mode.

19. The method according to claim 17,
wherein the circuit has a resume input terminal; and
including responding to an occurrence of a resume signal at the resume input terminal during the second operational mode by then operating in the first operational mode.

20. The method according to claim 17, including responding to an occurrence at the test circuit clock output terminal of a specified number of pulses of the test circuit clock signal, beginning from a specified point in time, by then operating in the second operational mode.

* * * * *